United States Patent
Nishimura et al.

(10) Patent No.: US 8,130,476 B2
(45) Date of Patent: Mar. 6, 2012

(54) TUNNELING MAGNETIC SENSING ELEMENT AND METHOD FOR MANUFACTURING THE SAME

(75) Inventors: Kazumasa Nishimura, Tokyo (JP); Masamichi Saito, Tokyo (JP); Yoshihiro Nishiyama, Tokyo (JP); Hidekazu Kobayashi, Tokyo (JP); Naoya Hasegawa, Tokyo (JP)

(73) Assignee: TDK Corporation, Tokyo (JP)

( * ) Notice: Subject to any disclaimer, the term of this patent is extended or adjusted under 35 U.S.C. 154(b) by 971 days.

(21) Appl. No.: 12/118,354

(22) Filed: May 9, 2008

(65) Prior Publication Data

US 2008/0278863 A1 Nov. 13, 2008

(30) Foreign Application Priority Data

May 11, 2007 (JP) ................. 2007-126416

(51) Int. Cl.
*G11B 5/33* (2006.01)
(52) U.S. Cl. ..................... 360/324.2; 360/324
(58) Field of Classification Search ............... 360/324.2, 360/324
See application file for complete search history.

(56) References Cited

U.S. PATENT DOCUMENTS

| 2005/0008849 A1* | 1/2005 | Kagami et al. ............... 428/328 |
| 2006/0119989 A1* | 6/2006 | Seyama et al. ............. 360/324.1 |
| 2007/0047159 A1* | 3/2007 | Zhao et al. ............... 360/324.12 |

FOREIGN PATENT DOCUMENTS

| JP | 2000-228003 | 8/2000 |
| JP | 2002-94142 | 3/2002 |
| JP | 2002-374020 | 12/2002 |
| JP | 2005-32780 | 2/2005 |
| JP | 2006-190780 | 7/2006 |

* cited by examiner

*Primary Examiner* — Daniell L Negron
*Assistant Examiner* — Carlos E Garcia
(74) *Attorney, Agent, or Firm* — Brinks Hofer Gilson & Lione (57) ABSTRACT

A tunneling magnetic sensing element includes: a pinned magnetic layer whose direction of magnetization is pinned in one direction; an insulating barrier layer; and a free magnetic layer whose direction of magnetization changes in response to an external magnetic field. The pinned magnetic layer, the insulating barrier layer and the free magnetic layer are deposited in the named order. A first protective layer composed of a platinum-group element is disposed on the free magnetic layer, and a second protective layer composed of Ti is disposed on the first protective layer.

6 Claims, 5 Drawing Sheets

TUNNELING MAGNETIC SENSING ELEMENT AND METHOD FOR MANUFACTURING THE SAME

CLAIM OF PRIORITY

This application claims benefit of the Japanese Patent Application No. 2007-126416 filed on May 11, 2007, the entire content of which is hereby incorporated by reference.

BACKGROUND

1. Field of the Invention

The present invention relates to magnetic sensing elements which utilizes a tunneling effect and which is to be mounted on magnetic reproducing devices, such as hard disk drives, or other magnetic sensing devices. More particularly, the invention relates to a tunneling magnetic sensing element which includes a free magnetic layer having low magnetostriction $\lambda$ and which has a high rate of change in resistance ($\Delta R/R$), the element thus having excellent magnetic sensitivity and stability, and a method for manufacturing the same.

2. Description of the Related Art

A tunneling magnetic sensing element (tunneling magnetoresistive element) causes a change in resistance utilizing a tunneling effect, wherein when the magnetization direction of a pinned magnetic layer is antiparallel to the magnetization direction of a free magnetic layer, a tunnel current does not easily flow through an insulating barrier layer (tunnel barrier layer) provided between the pinned magnetic layer and the free magnetic layer, and the resistance is at a maximum. On the other hand, when the magnetization direction of the pinned magnetic layer is parallel to the magnetization direction of the free magnetic layer, the tunnel current flows easily, and the resistance is at a minimum.

By use of the principle described above, a change in electrical resistance caused by a change in the magnetization of the free magnetic layer under an influence of an external magnetic field is captured as a change in voltage to detect a leakage magnetic field from a recording medium.

The following Patent Documents 1 to 5 disclose a tunneling magnetic sensing element having a protective layer with a single-layered or two-layered structure containing Ti or Ru or a method for manufacturing the tunneling magnetic sensing element.

Patent Document 1:
Japanese Unexamined Patent Application Publication No 2002-094142

Patent Document 2:
Japanese Unexamined Patent Application Publication No 2002-374020

Patent Document 3:
Japanese Unexamined Patent Application Publication No 2006-190780

Patent Document 4:
Japanese Unexamined Patent Application Publication No 2000-228003

Patent Document 5:
Japanese Unexamined Patent Application Publication No 2005-032780

In tunneling magnetic sensing elements, problems to be solved include increasing detection sensitivity by achieving a high rate of change in resistance ($\Delta R/R$) to improve the characteristics of a read head, and suppressing noise in read heads by reducing the magnetostriction $\lambda$ of a free magnetic layer to a value close to zero to enhance stability.

In existing tunneling magnetic sensing elements, a protective layer composed of tantalum (Ta) is disposed on the free magnetic layer.

However, when heat treatment is performed, Ta diffuses into the free magnetic layer or induces interfacial strain and interfacial stress with respect to the free magnetic layer, resulting in an increase in the magnetostriction $\lambda$ of the free magnetic layer.

For example, when an insulating barrier layer is composed of magnesium oxide (Mg—O), it is known that, in order to increase the rate of change in resistance ($\Delta R/R$) of the tunneling magnetic sensing element, it is preferable to provide an enhancement layer having a body-centered cubic (bcc) structure in a portion of the free magnetic layer in contact with the insulating barrier layer. However, when the enhancement layer is provided, the magnetostriction of the free magnetic layer increases. Therefore, a material that decreases the magnetostriction of the free magnetic layer is used for the portion other than the enhancement layer of the free magnetic layer so as to prevent the magnetostriction of the free magnetic layer from increasing.

However, even when such a structure in which the rate of change in resistance ($\Delta R/R$) can be increased and the magnetostriction $\lambda$ of the free magnetic layer can be decreased is employed, if a protective layer composed of Ta is disposed on the free magnetic layer, as above, the magnetostriction $\lambda$ of the free magnetic layer eventually increases as the heat treatment causes Ta to diffuse into the free magnetic layer. Moreover, diffusion of Ta into the enhancement layer or insulating barrier layer induces strain in the (bcc) structure and thus inhibits crystallization, thereby decreasing the rate of change in resistance ($\Delta R/R$).

When the protective layer is composed of Ta, moreover, since a milling rate of Ta is lower than those of materials used for forming other layers such as the free magnetic layer and the insulating barrier layer, the protective layer projects from the vicinity of the insulating barrier material after milling of a surface for facing a recording medium (Air Bearing Surface, hereinafter referred to as "ABS"). This causes a spacing loss with the recording medium, resulting in problems of a decrease in sensitivity and deterioration of SN ratio. Consequently it has been desired that the ABS can be made as flat as possible to prevent projection of the protective layer by composing the protective layer of a material having almost the same milling rate as those of materials used for forming other layers.

The above-identified Patent Documents 1 to 3 disclose a tunneling magnetic sensing element, in which a protective layer or a mutual diffusion layer including Ti is disposed on a free magnetic layer, or a method for manufacturing the tunneling magnetic sensing element. In any case, a single layer of Ti is disposed on the free magnetic layer.

The above-identified Patent Document 4 discloses a tunneling magnetic sensing element, in which a protective layer is a single-layeres film composed of a metal such as Ru or a two-layered film composed of TiW/Ru or the like. However, in such a two-layered film Ta or TiW layer is disposed directly on a free magnetic layer, and therefore it fails to disclose a two-layered protective layer having a platinum-group element directly on the free magnetic layer and having Ti on the platinum-group element.

The above-identified Patent Document 5 discloses a tunneling magnetic sensing element, in which a protective layer has a two-layered structure of Ti/Ru or the like. However, the metal layer to be disposed on a free magnetic layer is composed of Ti, Ta or the like, and therefore it fails to disclose having a platinum-group element on the free magnetic layer and having Ti on the platinum-group element. In addition, since Ta is used for a two-layered film disclosed in its embodiments, heat treatment causes diffusion of Ta to thereby increase the magnetostriction λ of the free magnetic layer, as described above.

If the protective layer does not contain Ta, the problems of an increase in the magnetostriction λ and a decrease in the rate of change in resistance (ΔR/R) will never be caused by diffusion of Ta into the free magnetic layer or the like. This also prevents the protective layer from projecting from the ABS after milling.

In the above-identified Patent Documents 1 to 5, however, since a single layer of Ti is disposed on the free magnetic layer as the protective layer or in the case where the protective layer has a multilayered structure, the layer to be in contact with the free magnetic layer is composed of Ti, Ti diffuses into the free magnetic layer and the insulating barrier layer to cause the problem of an increase in the magnetostriction λ.

SUMMARY

The present invention is to solve the problems of the prior art and more particularly has an object to provide a tunneling magnetic sensing element which includes a free magnetic layer having low magnetostriction λ and which has a high rate of change in resistance (ΔR/R), the element thus having excellent magnetic sensitivity and stability, and a method for manufacturing the same.

According to one aspect of the present invention, there is provided a tunneling magnetic sensing element comprising:

a pinned magnetic layer whose direction of magnetization is pinned in one direction;

an insulating barrier layer; and a free magnetic layer whose direction of magnetization changes in response to an external magnetic field, the pinned magnetic layer, the insulating barrier layer and the free magnetic layer being deposited in the named order, wherein a first protective layer composed of a platinum-group element is disposed on the free magnetic layer, and a second protective layer composed of titanium (Ti) is disposed on the first protective layer.

As described above, the first protective layer is composed of a platinum-group element and the second protective layer is composed of Ti. This prevents diffusion of Ta into the free magnetic layer, thereby reducing the magnetostriction λ of the free magnetic layer.

In addition, since the platinum-group element constituting the first protective layer and Ti constituting the second protective layer each has a higher milling rate than Ta has, the ABS after milling can be made flat to prevent projection of the protective layer.

Moreover, since the first protective layer that should be disposed in contact with the free magnetic layer is composed of a platinum-group element, Ti is prevented from easily diffusing into the free magnetic layer and the insulating barrier layer. Otherwise, Ti constituting the second protective layer would diffuse into the free magnetic layer and the insulating barrier layer. This suppresses an increase in the magnetostriction λ of the free magnetic layer.

The platinum-group element is preferably ruthenium (Ru).

The insulating barrier layer may be composed of aluminum oxide (Al—O) or titanium oxide (Ti—O).

Preferably, the free magnetic layer is formed by depositing first an enhancement layer of a CoFe alloy and then a soft magnetic layer of a NiFe alloy, the enhancement layer is disposed in contact with the insulating barrier layer, and the soft magnetic layer is disposed in contact with the first protective layer. The enhancement layer disposed in contact with the insulating barrier layer increases the rate of change in resistance (ΔR/R) of the tunneling magnetic sensing element because of having a high spin polarizability.

In this case, preferably, the insulating barrier layer is composed of magnesium oxide (Mg—O), and the enhancement layer has a body-centered cubic (bcc) structure. Since the protective layer does not contain Ta, Ta will never diffuse into the enhancement layer and the insulating barrier layer. Thus, crystallization of the enhancement layer and the insulating barrier layer are not inhibited, providing the enhancement layer and the insulating barrier layer with a body-centered cubic (bcc) structure, which results in an increase in the rate of change in resistance (ΔR/R).

In the case where a platinum-group element and Ti are deposited, interfacial strain and interfacial stress are low at interface between them. Accordingly, it is believed that since interfacial strain and interfacial stress are low at the interface between the first protective layer and the second protective layer, interfacial strain and interfacial stress to be applied to the free magnetic layer from the protective layer can be reduced to improve the crystallinity of the free magnetic layer. Thus, it is possible to increase the rate of change in resistance (ΔR/R) and also decrease the magnetostriction λ of the free magnetic layer without changing the composition and film thickness of the free magnetic layer.

According to another aspect of the present invention, there is provided a method for manufacturing a tunneling magnetic sensing element comprising:

forming a pinned magnetic layer and then forming an insulating barrier layer on the pinned magnetic layer;

forming a free magnetic layer on the insulating barrier layer;

forming a first protective layer on the free magnetic layer, the first protective layer being composed of a platinum-group element; and forming a second protective layer on the first protective layer, the second protective layer being composed of titanium (Ti).

With this method, since Ta will never diffuse into the free magnetic layer by heat treatment, there can be manufactured a tunneling magnetic sensing element whose free magnetic layer has a decreased magnetostriction λ.

In addition, since the protective layers are each composed of a metal having a higher milling rate than Ta, the ABS after milling can be made flat to prevent projection of the protective layer in the manufactured tunneling magnetic sensing element.

The platinum-group element is preferably ruthenium (Ru).

At the step (a), the insulating barrier layer may be composed of aluminum oxide (Al—O) or titanium oxide (Ti—O).

At the step (a), the insulating barrier layer may be composed of magnesium oxide (Mg—O), and at the step (b), the free magnetic layer may be formed by depositing first an enhancement layer of a CoFe alloy and then a soft magnetic layer of a NiFe alloy. In this case, the tunneling magnetic sensing element can be provided with a high rate of change in resistance (ΔR/R).

Moreover, since the protective layer does not contain Ta, Ta will never diffuse into the free magnetic layer by heat treatment. This improves crystallinity of the free magnetic layer and therefore increases the rate of change in resistance (ΔR/R). Furthermore, it is believed that interfacial strain and interfacial stress to be applied to the free magnetic layer from the protective layer can be reduced by composing the first protective layer of a platinum-group element. Therefore, a tunneling magnetic sensing element whose free magnetic layer has a decreased magnetostriction λ can be manufactured without changing the composition and film thickness of the free magnetic layer but maintaining a high rate of change in resistance (ΔR/R).

More preferably, annealing treatment is performed after the step (d). In the present invention, the first protective layer composed of a platinum-group element is disposed on the free magnetic layer. During the annealing treatment, accordingly, Ti constituting the second protective layer disposed on the first protective layer is effectively inhibited from diffusing into the free magnetic layer and the insulating barrier layer.

In the tunneling magnetic sensing element of the present invention, since the protective layer does not contain Ta, it is possible to decrease the magnetostriction λ of the free magnetic layer while maintaining a high rate of change in resistance (ΔR/R). Moreover, it is believed that composing the first protective layer of a platinum-group element prevents Ti constituting the second protective layer disposed on the first protective layer from easily diffusing into the free magnetic layer and the insulating barrier layer, thereby improves the crystallinity of the free magnetic layer. Therefore, the magnetostriction λ of the free magnetic layer can be decreased without changing the composition and film thickness of the free magnetic layer while achieving a high rate of change in resistance (ΔR/R).

In the tunneling magnetic sensing element of the present invention, since the protective layers are each composed of a metal having a higher milling rate than Ta has, the ABS after milling can be made flat. Accordingly, the protective layers are prevented from projecting and causing a spacing loss with a recording medium, resulting in improvement in sensitivity and SN ratio.

The present invention will be more fully understood from the detailed description given hereinbelow and the accompanying drawings which are given by way of illustration only, and thus are not to be considered as limiting the present invention.

DESCRIPTION OF THE PREFERRED EMBODIMENTS

Figure 1:
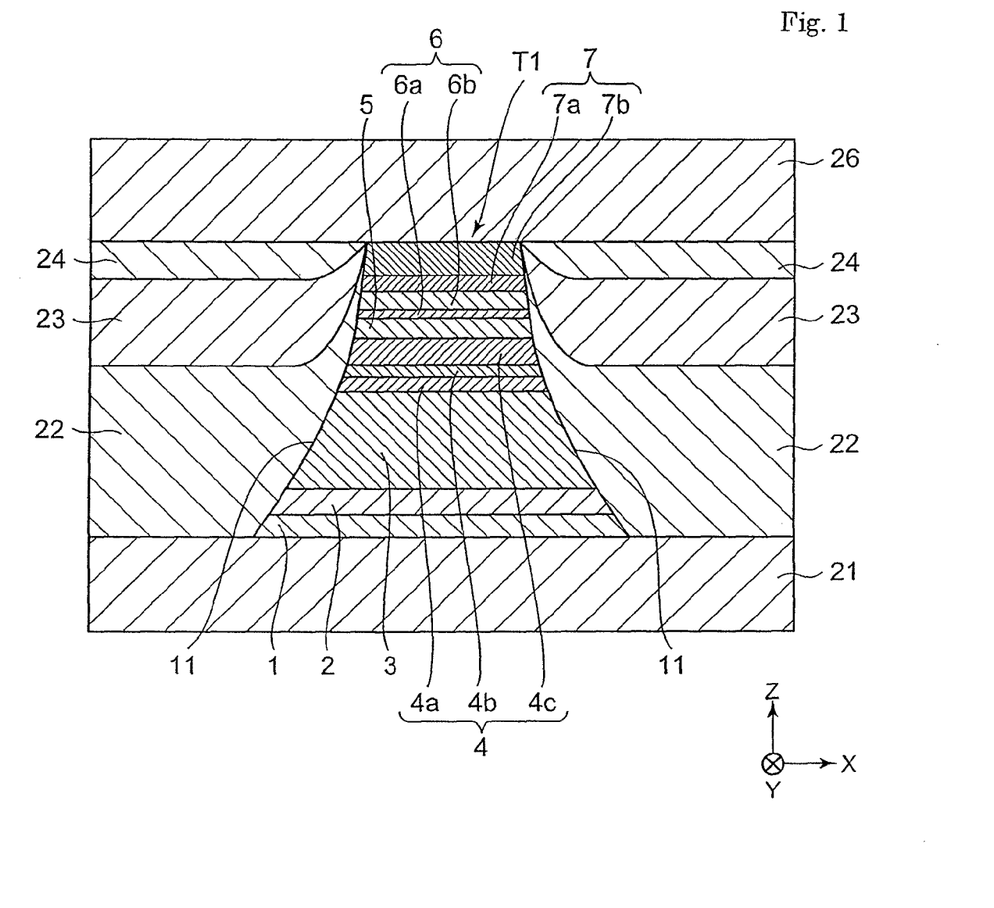
FIG. 1 is a cross-sectional view of a tunneling magnetic sensing element according to one embodiment of the present invention, taken along a direction parallel to a surface facing a recoding medium.

FIG. 1 is a cross-sectional view of a tunneling magnetic sensing element (tunneling magnetoresistive element) according to one embodiment of the present invention, taken along a direction parallel to a surface facing a recoding medium.

The tunneling magnetic sensing element is mounted on a trailing end of a floating-type slider provided on a hard disk drive to detect a recorded magnetic field from a hard disk or the like. In the drawings, the X direction corresponds to the track width direction, the Y direction corresponds to the direction of a leakage magnetic field from a magnetic recording medium (height direction), and the Z direction corresponds to the traveling direction of the magnetic recording medium, such as a hard disk, and the lamination direction of the individual layers in the tunneling magnetic sensing element.

Referring to FIG. 1, a lower shield layer 21, for example, composed of a NiFe alloy, is disposed at the bottom. A laminate Ti is disposed on the lower shield layer 21. The tunneling magnetic sensing element includes the laminate Ti, and a lower insulating layer 22, a hard bias layer 23, and an upper insulating layer 24 extending at both sides of the laminate T1 in the track width direction (X direction in the figure).

The bottom layer in the laminate T1 is an underlying layer 1 composed of a nonmagnetic material, such as one or two or more elements selected from the group consisting of Ta, Hf, Nb, Zr, Ti, Mo, and W. A seed layer 2 is disposed on the underlying layer 1.

The seed layer 2 is, for example, composed of Ru, NiFeCr or Cr. When the seed layer 2 is composed of Ru, for example, the seed layer 2 has a hexagonal close-packed (hcp) structure, and equivalent crystal planes represented as {0001} planes are preferentially oriented in the direction parallel to the film surface. When the seed layer 2 is composed of NiFeCr, the seed layer 2 has a face-centered cubic (fcc) structure, and equivalent crystal planes represented as {111} planes are preferentially oriented in the direction parallel to the film surface. When the seed layer 2 is composed of Cr, the seed layer 2 has a body-centered cubic (bcc) structure, and equivalent crystal planes represented as {110} planes are preferentially oriented in the direction parallel to the film surface. It should be noted that the underlying layer 1 may be omitted.

An antiferromagnetic layer 3 disposed on the seed layer 2 is preferably composed of an antiferromagnetic material containing Mn and an element X (wherein X is one or two or more elements selected from the group consisting of Pt, Pd, Ir, Rh, Ru, and Os).

The X—Mn alloys including such platinum-group elements as above X have excellent properties as antiferromagnetic materials, for example, including excellent corrosion resistance, high blocking temperature and large exchange coupling magnetic fields (Hex).

Alternatively, the antiferromagnetic layer 3 may be composed of an antiferromagnetic material containing Mn, the element X, and an element X' (wherein the element X' is one or two or more elements selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb and rare-earth elements).

A pinned magnetic layer 4 is disposed on the antiferromagnetic layer 3. The pinned magnetic layer 4 has a synthetic ferrimagnetic structure in which a first pinned magnetic sublayer 4a, a nonmagnetic intermediate sublayer 4b, and a second pinned magnetic sublayer 4c are disposed in that order from the bottom. The magnetizations of the first pinned magnetic sublayer 4a and the second pinned magnetic sublayer 4c are directed antiparallel by an exchange coupling magnetic field at the interfaces with the antiferromagnetic layer 3 and by an antiferromagnetic exchange coupling magnetic field (RKKY interaction) through the nonmagnetic intermediate sublayer 4b. This is a so-called synthetic ferrimagnetic structure, and with this configuration, the magnetization of the pinned magnetic layer 4 can be stabilized and the apparent exchange coupling magnetic field generated at the interface between the pinned magnetic layer 4 and the antiferromagnetic layer 3 can be increased. For example, each of the first pinned magnetic sublayer 4a and the second pinned magnetic sublayer 4c has a thickness of about 10 to 24 Å, and the nonmagnetic intermediate sublayer 4b has a thickness of about 8 to 10 Å.

The first pinned magnetic sublayer 4a is composed of a ferromagnetic material, such as Co—Fe, Ni—Fe, or Co—Fe—Ni. The nonmagnetic intermediate sublayer 4b is composed of a nonmagnetic conductive material, such as Ru, Rh, Ir, Cr, Re, or Cu. The second pinned magnetic sublayer 4c is composed of the same ferromagnetic material as the first pinned magnetic sublayer 4a or CoFeB.

An insulating barrier layer 5 is disposed on the pinned magnetic layer 4. The insulating barrier layer 5 is preferably composed of magnesium oxide (Mg—O), magnesium titanate (Mg—Ti—O), titanium oxide (Ti—O), or aluminum oxide (Al—O). In the case of Mg—O, the Mg content is preferably in the range of 40 to 60 atomic percent, and $Mg_{50at\%}O_{50at\%}$ is most preferable. Alternatively, the insulating barrier layer 5 may be composed of a laminate of magnesium (Mg) and Mg—O. The insulating barrier layer 5 may be formed directly by sputtering using a target composed of Mg, Mg—O, Mg—Ti—O, Ti—O, or Al—O. Alternatively, it may be formed such that a metal such as Mg, Ti, or Al is first deposited with a film thickness of 1 to 10 Å and then oxidized into a metal oxide such as Mg—O, Ti—O, or Al—O. In this case, because of the oxidation, the resulting film thickness is larger than that of the sputtered metal layer of Mg, Ti, or Al. Preferably, the resulting insulating barrier layer 5 has a film thickness of about 8 to 20 Å. If the film thickness of the insulating barrier layer 5 is excessively large, a tunnel current does not easily flow, which is undesirable.

A free magnetic layer 6 is disposed on the insulating barrier layer 5. The free magnetic layer 6 includes a soft magnetic layer 6b composed of a magnetic material, for example, a NiFe alloy and an enhancement layer 6a disposed between the soft magnetic layer 6b and the insulating barrier layer 5 and composed of, for example, a CoFe alloy. The magnetic layer 6b is preferably composed of a magnetic material having excellent soft magnetic properties. The enhancement layer 6a is preferably composed of a magnetic material having higher spin polarizability than the soft magnetic layer 6b has. When the soft magnetic layer 6b is composed of a NiFe alloy, in view of reduction in the magnetostriction and magnetic sensitivity of the free magnetic layer 6, the Ni content is preferably from 81.5 to 100 atomic percent.

By forming the enhancement layer 6a using a CoFe alloy having high spin polarizability, it is possible to increase the rate of change in resistance ($\Delta R/R$). In particular, a CoFe alloy having a high Fe content has high spin polarizability, and thus is highly effective in increasing the rate of change in resistance ($\Delta R/R$) of the element. The Fe content in the CoFe alloy is not particularly limited, but may be in the range of 10 to 100 atomic percent.

An excessively large film thickness of the enhancement layer 6a affects the magnetic sensitivity of the free magnetic layer 6, resulting in a decrease in detection sensitivity. Consequently, the enhancement layer 6a has a film thickness smaller than that of the soft magnetic layer 6b. The soft magnetic layer 6b has a film thickness of, for example, about 30 to 70 Å, and the enhancement layer 6a has a film thickness of about 10 Å. Preferably, the film thickness of the enhancement layer 6a is from 6 to 20 Å.

The free magnetic layer 6 may have a synthetic ferrimagnetic structure in which a plurality of magnetic layers are laminated together, each two adjacent magnetic layers being separated by a nonmagnetic intermediate layer. The width of the free magnetic layer 6 in the track width direction (X direction in the figure) defines the track width Tw.

A protective layer 7 is disposed on the free magnetic layer 6.

As described above, the laminate T1 is disposed on the lower shield layer 21. Both side faces 11, 11 of the laminate T1 in the track width direction (X direction in the figure) are formed as inclined surfaces such that the width in the track width direction gradually decreases upward.

As shown in FIG. 1, a lower insulating layer 22 extends at each side of the laminate T1 from the lower shield layer 21 to each side face 11 of the laminate T1. A hard bias layer 23 is disposed on the lower insulating layer 22, and an upper insulating layer 24 is disposed on the hard bias layer 23.

A bias underlying layer (not shown) may be disposed between the lower insulating layer 22 and the hard bias layer 23. The bias underlying layer is composed of, for example, Cr, W, or Ti.

Each of the insulating layers 22 and 24 is composed of an insulating material, such as $Al_2O_3$ or $SiO_2$. The insulating layers 22 and 24 insulate the upper and lower surfaces of the hard bias layer 23 so that a current flowing in the laminate T1 perpendicular to the interfaces between the individual layers is prevented from shunting to both sides of the laminate T1 in the track width direction. The hard bias layer 23 is composed of, for example, a cobalt-platinum (CoPt) alloy, a cobalt-chromium-platinum (CoCrPt) alloy, or the like.

An upper shield layer 26 composed of a NiFe alloy or the like is disposed over the laminate T1 and the upper insulating layer 24.

In the embodiment shown in FIG. 1, the lower shield layer 21 and the upper shield layer 26 serve as electrode layers for the laminate T1, so that a current flows in a direction perpendicular to the film surfaces of the individual layers of the laminate T1 (in a direction parallel to the Z direction in the figure).

The free magnetic layer 6 is magnetized in a direction parallel to the track width direction (X direction in the figure) under an influence of a bias magnetic field from the hard bias layer 23. On the other hand, each of the first pinned magnetic sublayer 4a and the second pinned magnetic sublayer 4c constituting the pinned magnetic layer 4 is magnetized in a direction parallel to the height direction (Y direction in the figure). Since the pinned magnetic layer 4 has a synthetic ferrimagnetic structure, the first pinned magnetic sublayer 4a and the second pinned magnetic sublayer 4c are magnetized antiparallel to each other. While the magnetization of the pinned magnetic layer 4 is pinned (does not vary in response to an external magnetic field), the magnetization of the free magnetic layer 6 varies in response to an external magnetic field.

When the magnetization of the free magnetic layer 6 varies in response to an external magnetic field and when the magnetization directions of the second pinned magnetic sublayer 4c and the free magnetic layer are antiparallel to each other, a tunnel current does not easily flow through the insulating barrier layer 5 disposed between the second pinned magnetic sublayer 4c and the free magnetic layer 6, and then the resistance is a maximum. On the other hand, when the magnetization directions of the second pinned magnetic sublayer 4c and the free magnetic layer 6 are parallel to each other, the tunnel current flows most easily, and then the resistance is a minimum.

By use of the principle described above, a change in electrical resistance caused by a change in the magnetization of the free magnetic layer 6 under an influence of an external magnetic field is captured as a change in voltage to detect a leakage magnetic field from a recording medium.

In the tunneling magnetic sensing element according to the present embodiment, a first protective layer 7a composed of a platinum-group element is disposed on the free magnetic layer 6, and a second protective layer 7b composed of Ti is disposed on the first protective layer 7a.

This makes it possible to increase the rate of change in resistance ($\Delta R/R$) as compared with the prior art and also decrease the magnetostriction $\lambda$ of the free magnetic layer 6 without changing the composition and/or film thickness of the free magnetic layer 6. In addition, since the ABS after milling is flat, the spacing loss with a recording medium can be decreased.

The platinum-group element may be selected from the group consisting of ruthenium (Ru), rhodium (Rh), palladium (Pd), osmium (Os), iridium (Ir), and platinum (Pt). Among them, preferred is Ru or Pt, more preferred is Ru.

The first protective layer 7a is formed on the free magnetic layer 6, for example, by sputtering Ru or Pt. The film thickness of the first protective layer 7a is preferably 5 to 200 Å, more preferably 5 to 50 Å.

If the film thickness of the first protective layer 7a is less than 5 Å, it is not possible to appropriately inhibit Ti constituting the second protective layer 7b disposed on the first protective layer 7a from diffusing into the free magnetic layer 6 and the insulating barrier layer 5. Thus, it is preferred that the film thickness of the first protective layer 7a is 5 Å or more.

The second protective layer 7b is composed of Ti. Like the first protective layer 7a, the second protective layer 7b may also be formed by sputtering. The film thickness of the second protective layer 7b may be either larger or smaller than that of the first protective layer 7a, but if the film thickness of Ti is excessively large, the gap length between the upper and lower shields also becomes too large. Therefore, the film thickness of the second protective layer 7b is preferably from 10 to 300 Å.

In the present embodiment, since the protective layer is composed of a platinum-group element and Ti and does not contain Ta, heat treatment will never cause the problem that Ta of the protective layer diffuses into the soft magnetic layer 6b and the enhancement layer 6a to increase the magnetostriction $\lambda$ of the free magnetic layer.

In addition, since the platinum-group element and Ti constituting the protective layer each has a higher milling rate than Ta has, the ABS can be made flat with the protective layer being milled to the same level as other layers by milling of the ABS. This eliminates the spacing loss with a recording medium, which is due to projection of the protective layer.

In the present embodiment, it is preferred that the free magnetic layer 6 has a layered structure including the enhancement layer 6a and the soft magnetic layer 6b. The enhancement layer 6a composed of a CoFe alloy has a higher spin polarizability than the soft magnetic layer 6b has and is effective in improving the rate of change in resistance ($\Delta R/R$). Even in the prior art, accordingly, the rate of change in resistance ($\Delta R/R$) can be increased by interposing the enhancement layer 6a between the insulating barrier layer 5 and the soft magnetic layer 6b. In a case where the insulating barrier layer 5 is composed of Mg—O, however, a high rate of change in resistance ($\Delta R/R$) can be obtained by providing the enhancement layer 6a, which is in contact with the insulating barrier layer 5, with a body-centered cubic (bcc) structure, but if Ta is used for forming the protective layer 7, Ta diffusing by heat treatment inhibits crystallization of the enhancement layer 6a and the insulating barrier layer 5, causing strain in the body-centered cubic (bcc) structure and thus making it impossible to obtain a high rate of change in resistance.

In the present embodiment, on the other hand, since Ta is not used for the protective layer, heat treatment will never cause diffusion of Ta. This provides the enhancement layer 6a and the insulating barrier layer 5 with an appropriate body-centered cubic (bcc) crystal structure, thereby making it possible to increase the rate of change in resistance ($\Delta R/R$) without changing the composition of the enhancement layer 6a and other features of the free magnetic layer 6.

In the present embodiment, the first protective layer 7a composed of a platinum-group element is disposed on and in contact with the free magnetic layer 6. This prevents interdiffusion between the free magnetic layer 6 and the second protective layer 7b composed of Ti, reducing the magnetostriction $\lambda$ of the free magnetic layer 6.

Referring to the experiment described hereinafter, it is seen that when the protective layer 7 is composed only of Ti, the free magnetic layer has high magnetostriction $\lambda$. From this, it is believed that Ti constituting the second protective layer 7b can also diffuse into the free magnetic layer 6 and the insulating barrier layer 5 by heat treatment. Referring to the same experiment, however, it is seen that the magnetostriction t of the free magnetic layer is low in the present embodiment in which the first protective layer 7a composed of a platinum-group element is disposed on the free magnetic layer 6 and the second protective layer 7b composed of Ti is disposed on the first protective layer 7a. From this, it is believed that interposing the first protective layer 7a of a platinum-group element between the free magnetic layer 6 and the second protective layer 7b of Ti inhibits Ti of the second protective layer 7b from diffusing into the free magnetic layer 6 and the insulating barrier layer 5, thereby decreasing the magnetostriction $\lambda$ of the free magnetic layer 6.

In the prior art, there is known a device in which the first protective layer 7a disposed on the free magnetic layer 6 is composed of Ru and the second protective layer 7b disposed on the first protective layer 7a is composed of Ta. In this case, since the interfacial strain and interfacial stress at the interface between Ru of the first protective layer 7a and Ta of the second protective layer 7b are large, the interfacial strain and interfacial stress affect the free magnetic layer 6 and the insulating barrier layer 5, thereby inhibiting crystallization of the free magnetic layer 6 and the insulating barrier layer 5 and thus making it impossible to have an appropriate body-centered cubic (bcc) structure. Particularly in the case where the insulating barrier layer is composed of Mg—O, it is impossible to obtain high rate of change in resistance ($\Delta R/R$).

In the present embodiment, the interfacial strain and interfacial stress at the interface between the platinum-group element of the first protective layer 7a and Ti of the second protective layer 7b are small, they are less prone to inhibit crystallization of the free magnetic layer 6 and the insulating barrier layer 5. Thus the free magnetic layer 6 and the insulating barrier layer 5 have an appropriate body-centered cubic (bcc) crystal structure, increasing the rate of change in resistance ($\Delta R/R$) particularly when the insulating barrier layer is composed of Mg—O.

In the present embodiment; when the insulating barrier layer 5 is composed of Mg—O, the second pinned magnetic sublayer 4c is preferably composed of CoFeB and has an amorphous structure. This provides the insulating barrier layer 5 with a body-centered cubic (bcc) structure and also provides the enhancement layer 6a, which is to be disposed on the insulating barrier layer 5, with a body-centered cubic (bcc) structure.

Figure 2:
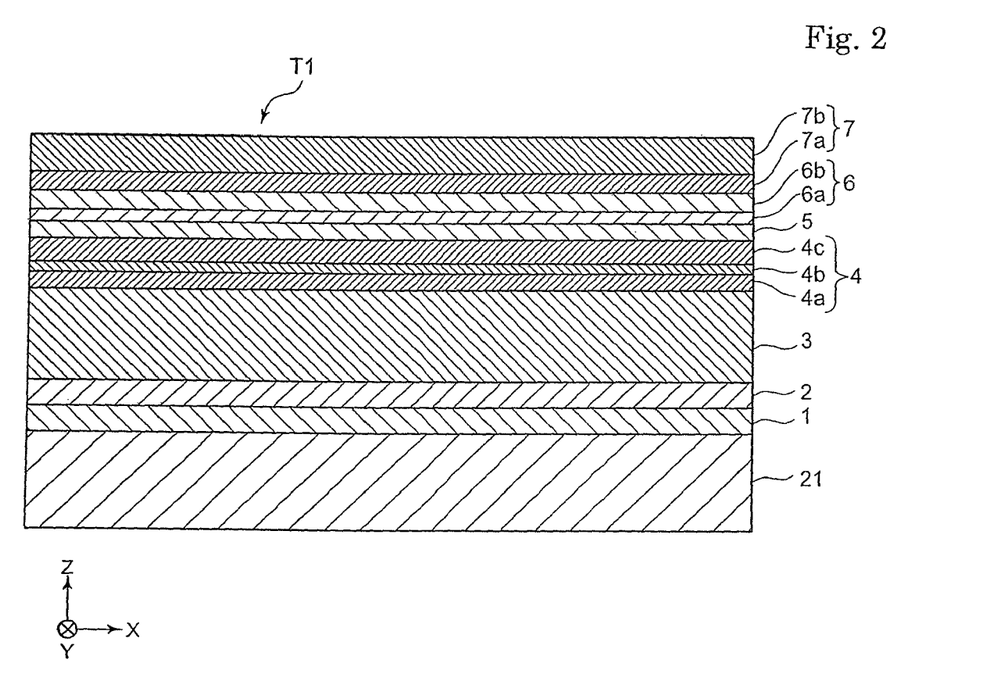
FIG. 2 is a diagram showing a step of a method for manufacturing a tunneling magnetic sensing element according to one embodiment of the present invention (cross-sectional view of a tunneling magnetic sensing element in a manufacturing process, taken along a direction parallel to a surface facing a recoding medium)
Figure 3:
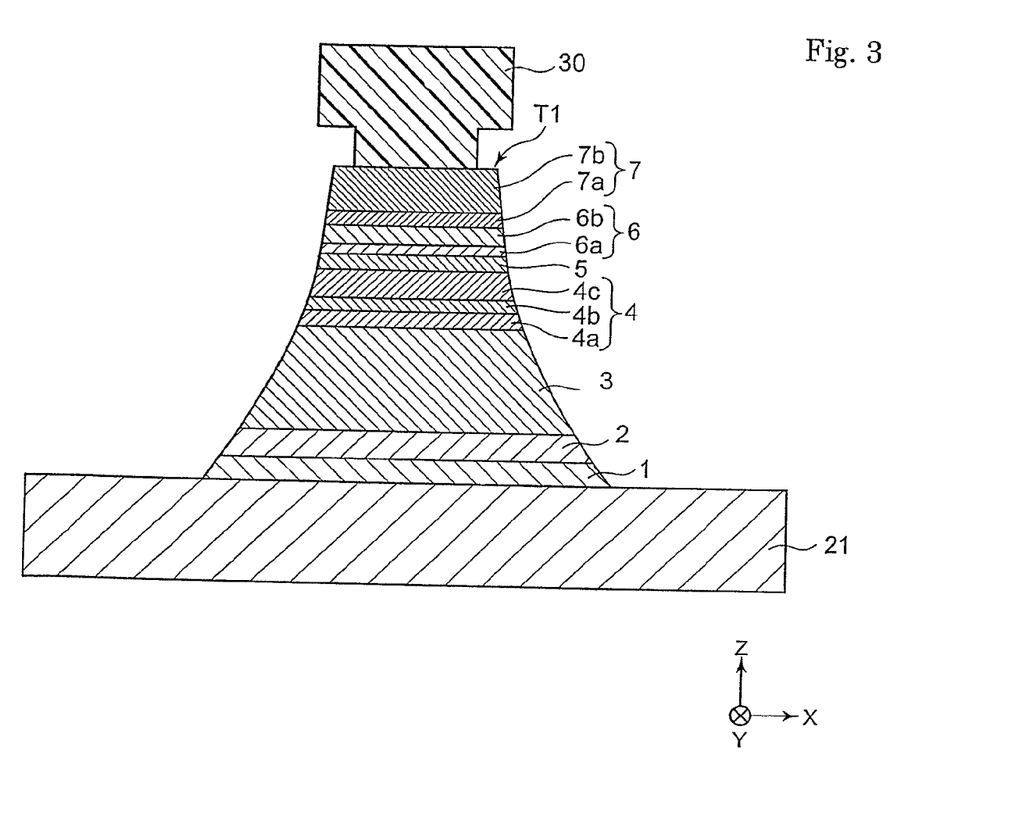
FIG. 3 is a diagram showing a step subsequent to the step shown in FIG. 2 (cross-sectional view of a tunneling magnetic sensing element in a manufacturing process, taken along a direction parallel to a surface facing a recoding medium)
Figure 4:
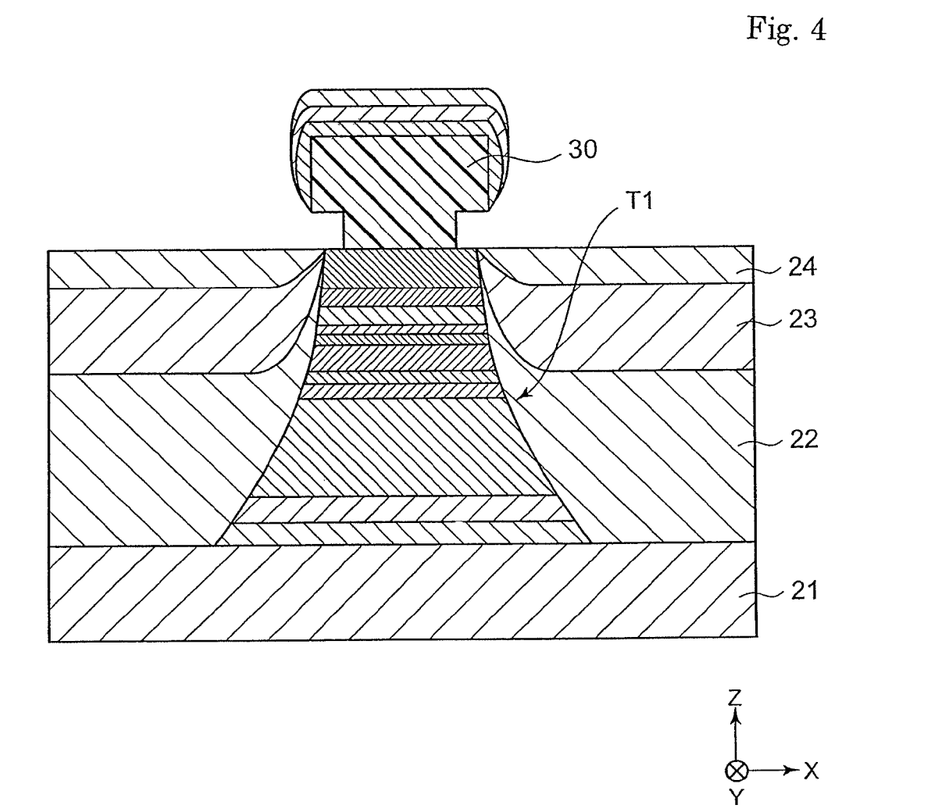
FIG. 4 is a diagram showing a step subsequent to the step shown in FIG. 3 (cross-sectional view of a tunneling magnetic sensing element in a manufacturing process, taken along a direction parallel to a surface facing a recoding medium)

A method for manufacturing the tunneling magnetic sensing element according to this embodiment will be described below. FIGS. 2 to 4 are each a partial cross-sectional view of the tunneling magnetic sensing element in a manufacturing process, taken along the same direction as in FIG. 1.

In the step shown in FIG. 2, an underlying layer 1, a seed layer 2, an antiferromagnetic layer 3, a first pinned magnetic sublayer 4a, a nonmagnetic intermediate sublayer 4b, and a second pinned magnetic sublayer 4c are continuously formed on a lower shield layer 21.

Subsequently, an insulating barrier layer 5 is formed by sputtering or the like on the second pinned magnetic sublayer 4c. Alternatively, the insulating barrier layer 5 may be formed such that a metal layer is similarly formed by sputtering or the like and then oxygen is introduced into the vacuum chamber to oxidize the metal layer. Instead of the metal layer, a semiconductor layer may be formed. Since the film thickness of the metal layer or the semiconductor layer increases with oxidation, the metal layer or the semiconductor layer should be formed such that the film thickness after oxidation corresponds to the film thickness of the insulating barrier layer 5. Examples of the oxidation method include radical oxidation, ion oxidation, plasma oxidation, and natural oxidation.

In the present embodiment, the insulating barrier layer 5 is preferably composed of magnesium oxide (Mg—O), magnesium titanate (Mg—Ti—O), titanium oxide (Ti—O), or aluminum oxide (Al—O). In the case of Mg—O, the Mg content is preferably in the range of 40 to 60 atomic percent, and $Mg_{90at\%}O_{50at\%}$ is most preferable. Alternatively, the insulating barrier layer 5 may be a laminate of magnesium (Mg) and Mg—O.

The insulating barrier layer 5 may be formed by sputtering using a target composed of Mg or Mg—O, Mg—Ti—O, Ti—O, or Al—O having a predetermined composition ratio. In case of Mg—O, Ti—O, or Al—O, it may also be formed such that a metal such as Mg; Ti or Al is first deposited with a film thickness of 1 to 10 Å and then oxidized to a metal oxide such as Mg—O, Ti—O, or Al—O.

Subsequently, a free magnetic layer 6 including an enhancement layer 6a composed of CoFe and a soft magnetic layer 6b composed of NiFe is formed on the insulating barrier layer 5. Furthermore, a first protective layer 7a composed of a platinum-group element is disposed on the free magnetic layer 6 and then a second protective layer 7b composed of Ti is disposed on the first protective layer 7a. In such a manner, there is obtained a laminate T1 in which the layers from the underlying layer 1 to the protective layer 7 are stacked.

Subsequently, a resist layer 30 for lift-off processing is formed on the laminate T1, and then both side regions of the laminate T1 in the track width direction (X direction in the figure), which are not covered with the resist layer 30 for lift-off processing, are removed by etching or the like (refer to FIG. 3).

Subsequently, a lower insulating layer 22, a hard bias layer 23, and an upper insulating layer 24 are deposited in that order, at each side of the laminate T1 in the track width direction (X direction in the figure) and on the lower shield layer 21 (refer to FIG. 4).

Subsequently, the resist layer 30 for lift-off processing is removed, and then an upper shield layer 26 is formed over the laminate T1 and the upper insulating layer 24.

The method for manufacturing the tunneling magnetic sensing element described above includes annealing treatment. Typically, the annealing treatment is carried out in a magnetic field for producing an exchange coupling magnetic field (Hex) between the antiferromagnetic layer 3 and the first pinned magnetic sublayer 4a. The annealing treatment is carried out at a temperature of 240 to 310° C.

In the present embodiment, the first protective layer 7a is composed of a platinum-group element and the second protective layer 7b is composed of Ti, and thus Ta is not used for the protective layers. Thus, the annealing treatment in a magnetic field or another annealing treatment will never cause the problem that Ta diffuses into the free magnetic layer 6 and the insulating barrier layer 5 to increase the magnetostriction λ of the free magnetic layer. In addition, since the first protective layer 7a composed of a platinum-group element inhibits diffusion of Ti of the second protective layer 7b, the magnetostriction λ of the free magnetic layer can be reduced. Moreover, since the interfacial strain and interfacial stress are low at the interface between the first protective layer 7a composed of a platinum-group element and the second protective layer 7b composed of Ti, the free magnetic layer 6 and the insulating barrier layer 5 have an appropriate body-centered cubic (bcc) crystal structure, resulting in high rate of change in resistance (ΔR/R).

As described above, a tunneling magnetoresistive element which has a high rate of change in resistance (ΔR/R) and whose free magnetic layer 6 has a low magnetostriction λ can be manufactured appropriately and easily without changing the composition and film thickness of the free magnetic layer 6.

In addition to use in a hard disk drive, the tunneling magnetic sensing element according to the present embodiment can also be used as a MRAM (magnetoresistive random access memory) or a magnetic sensor.

While the present invention has been particularly shown and described with reference to embodiments thereof, it will be understood by those skilled in the art that various changes in form and detail may be made therein without departing from the spirit, scope and teaching of the invention.

EXAMPLE 1

A tunneling magnetic sensing element shown in FIG. 1 was fabricated.

A laminate T1 was formed by depositing, from the bottom, underlying layer 1; Ta(30)/seed layer 2; Ru(40)/antiferromagnetic layer 3; $Ir_{26at\%}Mn_{74at\%}(70)$/pinned magnetic layer 4 [first pinned magnetic sublayer 4a; $Co_{70at\%}Fe_{30at\%}(14)$/nonmagnetic intermediate sublayer 4b; Ru(9.1)/second pinned magnetic sublayer 4c: $Co_{40at\%}Fe_{40at\%}B_{20at\%}(18)$]/insulating barrier layer 5; MgO(11)/free magnetic layer 6 [enhancement layer 6a; $Co_{50at\%}Fe_{50at\%}(10)$/soft magnetic layer 6b; $Ni_{87at\%}Fe_{13at\%}(50)$]/protective layer 7 [first protective layer 7a; Ru(20)/second protective layer 7b; Ti(180)]. Each of the values in parentheses indicates an average film thickness in terms of Å. After the laminate T1 was formed, annealing treatment was carried out at 270° C. for 3 hours 30 minutes.

COMPARATIVE EXAMPLE 1

A tunneling magnetic sensing element was fabricated as in Example 1 except that the protective layer 7 was formed as

[first protective layer 7a; Ru(20)/second protective layer 7b; Ta(180)] (Comparative Example 1).

COMPARATIVE EXAMPLE 2

A tunneling magnetic sensing element was fabricated as in Example 1 except that the protective layer 7 was formed as a single layer of Ti(180) without forming the first protective layer 7a (Comparative Example 2).

COMPARATIVE EXAMPLE 3

A tunneling magnetic sensing element was fabricated as in Example 1 except that the protective layer 7 was formed with the deposition order of Example 1 inverted to [first protective layer 7a; Ti(180)/second protective layer 7b; Ru(20)] (Comparative Example 3).

The tunneling magnetic sensing elements of Example 1 and Comparative Examples 1 to 3 were measured for the rate of change in resistance (ΔR/R), element resistance R×element area A (RA), and the magnetostriction (λ) of the free magnetic layer 6. The results are shown in Table 1. From the results of Table 1, moreover, the relationship between RA (element resistance R×element area A) and ΔR/R (rate of change in resistance) is shown in FIG. 5, and the magnetostriction (λ) of the free magnetic layer in each of Example 1 and Comparative Examples 1 to 3 is shown in FIG. 6.

TABLE 1

| | $1^{st}$ protective layer | $2^{nd}$ protective layer | | | |
| | Values in parentheses indicate film thickness Å | | RA ($\Omega \cdot \mu m^2$) | ΔR/R (%) | λ (ppm) |
|---|---|---|---|---|---|
| Ex. 1 | Ru (20) | Ti (180) | 3.0 | 80.1 | 1.19 |
| Com. Ex. 1 | Ru (20) | Ta (180) | 3.3 | 75.5 | 0.87 |
| Com. Ex. 2 | Ti (180) | — | 3.4 | 84.2 | 7.78 |
| Com. Ex. 3 | Ti (180) | Ru (20) | 3.4 | 82.0 | 7.56 |

Figure 5:
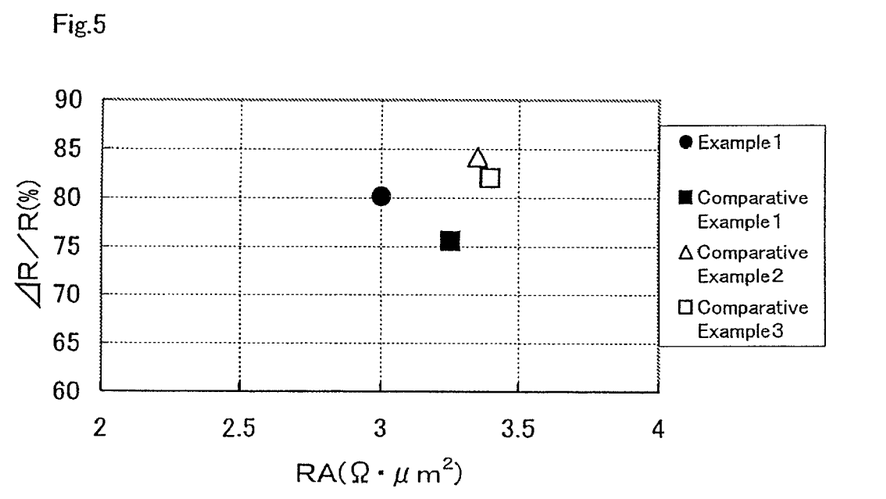
FIG. 5 is a graph showing a relationship between RA (element resistance R×element area A) and ΔR/R (rate of change in resistance) of tunneling magnetic sensing elements of Example 1 and Comparative Examples 1 to 3.
Figure 6:
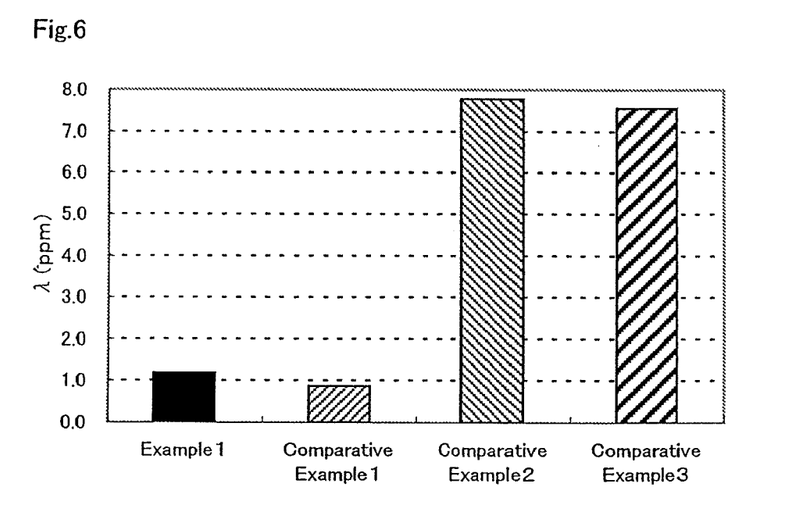
FIG. 6 is a graph showing magnetostriction (λ) of a free magnetic layer in tunneling magnetic sensing elements of Example 1 and Comparative Examples 1 to 3.

As shown in FIG. 5, Example 1, in which the protective layer 7 had a layered structure including the first protective layer 7a of Ru being a platinum-group element and the second protective layer 7b of Ti, had a higher rate of change in resistance (ΔR/R) than Comparative Example 1 with a conventional structure had. In addition, Example 1 had a lower RA than Comparative Example 1 had. In tunneling magnetic sensing elements, generally, as the RA (element resistance R×element area A) increases, it becomes difficult to achieve a higher recoding density, and therefore it is desirable that a high rate of change in resistance (ΔR/R) can be obtained within a low range of RA (element resistance R×element area A). Accordingly, the tunneling magnetic sensing element of Example 1 is more desirable than the tunneling magnetic sensing element of Comparative Example 1.

From above, it is seen that a high rate of change in resistance (ΔR/R) can be obtained at a low RA by composing the first protective layer 7a of Ru, which is a platinum-group element, and composing the second protective layer 7b of Ti.

Comparative Example 2, in which the protective layer 7 was composed only of Ti, and Comparative Example 3, in which the first protective layer 7a was composed of Ti, both had an improved rate of change in resistance (ΔR/R) as compared with Comparative Example 1 having a conventional structure and also exhibited a higher rate of change in resistance (ΔR/R) than Example 1 did. However, Comparative Examples 2 and 3 are not desirable as a tunneling magnetic sensing element because of having a higher RA than Comparative Example 1 has as well as than Example 1 has.

As shown in FIG. 6, the magnetostriction λ of the free magnetic layer of Example 1 was almost the same as that of Comparative Example 1. On the other hand, the magnetostrictions λ of the free magnetic layer of Comparative Examples 2 and 3 were considerably higher than those of Example 1 and Comparative Example 1. This seems to be because in Comparative Examples 2 and 3 in which Ti was deposited on the free magnetic layer, the heat treatment caused diffusion of Ti to increase the magnetostriction λ of the free magnetic layer. In Example 1, on the other hand, it is believed that the first protective layer 7a of Ru being a platinum-group element interposed between the second protective layer 7b of Ti and the free magnetic layer 6 inhibited diffusion of Ti to decrease the magnetostriction λ of the free magnetic layer.

From above, it is seen that the magnetostriction λ of the free magnetic layer can be decreased by composing the first protective layer 7a of Ru, which is a platinum-group element, and composing the second protective layer 7b of Ti.

Comparing the milled ABSs of the tunneling magnetic sensing elements of Example 1 and Comparative Example 1, the ABS of Comparative Example 1 had a projection at the protective layer, while the ABS of Example 1 was flat. From this, it is seen that projection of the ABS can be inhibited by composing the protective layer of Ti having a higher milling rate than Ta has.

The invention claimed is:

1. A tunneling magnetic sensing element comprising:
   a pinned magnetic layer whose direction of magnetization is pinned in one direction;
   an insulating barrier layer; and
   a free magnetic layer whose direction of magnetization changes in response to an external magnetic field, said pinned magnetic layer, said insulating barrier layer and said free magnetic layer being deposited in the named order,
   wherein a first protective layer composed of Ru is disposed directly on said free magnetic layer, and a second protective layer composed of Ti is disposed on said first protective layer,
   wherein said free magnetic layer is formed by depositing first an enhancement layer of a CoFe alloy and then a soft magnetic layer of a NiFe alloy, said enhancement layer is disposed in contact with said insulating barrier layer, and said soft magnetic layer is disposed in contact with said first protective layer,
   wherein said insulating barrier layer is composed of Mg—O,
   wherein said pinned magnetic layer comprises a first and second pinned magnetic sublayers, said second pinned magnetic sublayer is composed CoFeB and has an amorphous structure, and
   wherein said insulating barrier layer disposed on the second pinned magnetic sublayer and said enhancement layer each has a body-centered cubic (bcc) structure.

2. The tunneling magnetic sensing element according to claim 1, wherein said enhancement layer has a profile thickness in a range between 6 Å to 20 Å.

3. The tunneling magnetic sensing element according to claim 1, wherein said first protective layer has a profile thickness in a range between 5 Å to 50 Å.

4. The tunneling magnetic sensing element according to claim 1, wherein said second protective layer has a profile thickness in a range between 10 Å to 300 Å.

5. The tunneling magnetic sensing element according to claim 1, wherein said tunneling magnetic sensing element is anneal treated.

6. The tunneling magnetic sensing element according to claim 1, wherein said first and second protective layers do not contain Ta.

* * * * *